United States Patent
Fukutomi et al.

[11] Patent Number: 5,322,079
[45] Date of Patent: Jun. 21, 1994

[54] SUBSTRATE HOLDING APPARATUS OF A SIMPLE STRUCTURE FOR HOLDING A ROTATING SUBSTRATE, AND A SUBSTRATE PROCESSING APPARATUS INCLUDING THE SUBSTRATE HOLDING APPARATUS

[75] Inventors: Yoshiteru Fukutomi; Masami Ohtani; Yasushi Nakamura, all of Kyoto, Japan

[73] Assignee: Dainippon Screen Mfg. Co., Ltd., Japan

[21] Appl. No.: 952,281

[22] Filed: Sep. 28, 1992

[30] Foreign Application Priority Data

Sep. 27, 1991 [JP] Japan .................. 3-276915

[51] Int. Cl.$^5$ .............................................. B08B 3/02
[52] U.S. Cl. .................................... 134/153; 134/157; 269/57
[58] Field of Search ............. 134/153, 157, 902, 25.4; 269/56, 57, 909

[56] References Cited

U.S. PATENT DOCUMENTS

| | | | |
|---|---|---|---|
| 2,968,080 | 1/1961 | Threlfall | 269/57 |
| 5,032,217 | 7/1991 | Tanaka | 134/25.4 |

FOREIGN PATENT DOCUMENTS

| | | | |
|---|---|---|---|
| 59-204239 | 11/1984 | Japan | 134/902 |
| 60-267508 | 11/1985 | Japan . | |
| 61-285752 | 11/1986 | Japan . | |
| 63-185029 | 7/1988 | Japan | 134/902 |
| 63-236575 | 9/1988 | Japan . | |
| 2-209748 | 8/1990 | Japan | 134/902 |
| 3-19742 | 1/1991 | Japan | 269/57 |
| 3-30426 | 2/1991 | Japan | 134/902 |
| 3-218016 | 9/1991 | Japan | 134/902 |

*Primary Examiner*—Frankie L. Stinson
*Attorney, Agent, or Firm*—Ostrolenk, Faber, Gerb & Soffen

[57] ABSTRACT

A substrate holding apparatus includes a rotary table rotatable about a vertical center axis for supporting a substrate in a horizontal plane, and substrate travel regulating pins fixed to the rotary table and arranged at positions in contact with the outer edge of the substrate so that the center of gravity of the substrate supported on the rotary table is spaced from the center axis for regulating the travel of the substrate in a horizontal direction. Centrifugal force generated with respect to the substrate when the rotary table rotates about the center axis, urges the periphery of the substrate towards the travel regulating pins so that the resulting frictional force prevents rotary slippage between the substrate and the rotary table as rotation of the latter relates to the latter. The structure of this apparatus is simple because the substrate holding portion does not include a movable portion. It is easy to mount a substrate onto this apparatus because it is not necessary to align the orientation flat and the like at a predetermined position.

23 Claims, 6 Drawing Sheets

SUBSTRATE HOLDING APPARATUS OF A SIMPLE STRUCTURE FOR HOLDING A ROTATING SUBSTRATE, AND A SUBSTRATE PROCESSING APPARATUS INCLUDING THE SUBSTRATE HOLDING APPARATUS

BACKGROUND OF THE INVENTION

1. Field of the Invention

The present invention relates to a substrate processing apparatus for rotating a substrate to process the surface thereof, and more particularly relates to apparatus for processing a substantially circular substrate such as a semiconductor wafer with a cut such as an orientation flat or a notch formed therein, or processing a complete circular substrate such as an optical disk substrate mounted on a rotary table. The surface of the substrate is processed by applying processing solutions such as detergent and etchant to the surface thereof. The present invention further relates to a substrate holding apparatus for holding and rotating a substrate in such a substrate processing apparatus.

2. Description of Related Art

A spin coater, a spin drier, a spin developer used in the processing steps of a semiconductor wafer are known as substrate processing apparatus. Apparatus of this type includes a substrate holding apparatus for holding and rotating a wafer. A predetermined process is carried out on the surface of the wafer by providing a resist solution, a developer and the like on a rotating wafer, or by dropping a resist solution or a developer on a stationary wafer and then rotating the wafer.

It is well known that during wafer processing the generation of a contaminant or a defect on the surface of a semiconductor wafer must be suppressed. Consider a case where a wafer skids on a substrate holding apparatus during rotation of the wafer in a rotary substrate processing apparatus. This may result in the bottom of the wafer being abraded against the wafer holding apparatus to generate particles, or the flow of the processing solution on the surface of the wafer may be disturbed. There is also a possibility of damaging the bottom of the wafer. It is necessary to prevent the wafer from skidding in order to avoid such problems.

A conventional substrate holding apparatus known to prevent such skidding of a wafer is shown in FIGS. 1 and 2. The substrate holding apparatus of FIGS. 1 and 2 is described in the document of Japanese Patent Application No. 61-285752 filed on Nov. 29, 1986 in Japan by the same assignee of the present application, claiming priority based on Japanese Patent Application No. 61-190246 filed on Aug. 13, 1986 in Japan. The Japanese Application 61-285752 was laid-open to the public as Japanese Patent Laying-Open No. 63-153839 on Jun. 27, 1988 and published as Japanese Patent Publication No. 3-9607 on Feb. 8, 1991.

Referring to FIGS. 1 and 2, the conventional substrate holding apparatus 30 includes a rotary plate 36 secured to the upper end of vertical shaft so as to be rotatable in a horizontal plane about the center axis of a vertically mounted shaft 34 having the center bottom fixed to the that extends upward from a motor (not shown). The rotary plate 36 includes six arms 52 projecting radially at equal intervals.

Every other arm of the six arms, i.e. three arms 52 have a fixed claw 38 on the surface of its respective tips for supporting the bottom of a wafer 32 and for regulating the travel of the wafer 32 in the horizontal direction.

The remaining every other three arms 52 have a movable claw 40 on the surface of its respective tips for supporting the bottom of the wafer 32, and pivotable between a position of urging against the periphery of the wafer 32 and a position not urging the periphery of the wafer 32. The claws 38 and 40 are arranged around the center of rotation in a circular manner.

The movable claw 40 is provided on a swingable arm 50 provided on the tip of arm 52 and pivots with swingable arm 50. Movable claw 40 includes a wafer supporting portion 42 for supporting the lower surface of the wafer, with its own axis coaxial with the center axis of rotation of swingable arm 50, and a claw portion 44 projecting from the top of the wafer supporting portion 42 and displace from the center axis of wafer supporting portion 42. When the tip of the inner surface of the claw portion 44 is directed towards the center of the rotary plate 36, wafer 32 is urged towards the center by the claw portion 44. The wafer 32 is released from the urged position by the movable claw 40 pivoting so that the tip of the inner surface of the claw portion 44 is directed sideward.

The mechanism of driving the movable claw 40 includes a link rotatable plate 48 provided at the center of the upper face of the rotary plate 36, a link 46 having one end attached swingably to the link rotatable plate 48, a swingable arm 50 having one end attached rotatably to the other end of the link 46 and the other end swingable attached to the base of the claw portion 40, a biasing mechanism not shown for biasing the link rotatable plate 48 counterclockwise, and a driving mechanism not shown for rotating clockwise the link rotatable plate 48 through a predetermined angle against the biasing force of the biasing mechanism.

Referring to FIGS. 1 and 2, the conventional substrate holding apparatus operates as follows. The link rotatable plate 48 is rotated clockwise through a predetermined angle using the driving mechanism not shown. Each movable claw 40 pivots by a predetermined angle counterclockwise about the center axis thereof, as shown in solid lines in FIG. 1, by means of the link 46 and the swingable arm 50. This causes the claw portion 44 to be displaced counterclockwise from the center and take a position not pressing the edge of wafer 32. With the movable claw 40 at this position, the wafer 32 is mounted on the wafer supporting portion of the fixed claw 38 and the movable claw 40. Then, the driving mechanism of the link rotatable plate 48 is stopped. The link rotatable plate 48 is rotated through a predetermined angle counterclockwise by the biasing mechanism not shown. The movable claw 40 pivots through a predetermined angle clockwise, as shown in chain lines with two dots in FIG. 1, by means of the link 46 and the swingable arm 50. This causes the claw portion 44 of the movable claw 40 to move toward the center of the rotary plate 36. The side face of the wafer 32 is pressed by the claw portion 44. The wafer 32 is fixed in the substrate holding apparatus 30 by means of the three claw portions 44 of the movable claws 40 pressing against the side face of wafer 32. Wafer 32 can be fixed in the substrate holding apparatus 30 even if the wafer 32 has a circular configuration.

The substrate holding apparatus 30 of FIGS. 1 and 2 requires a mechanism for driving the movable claw 40 to hold the wafer 32. This mechanism includes the link mechanism and the mechanism for driving this link in the substrate holding apparatus 30 shown in FIGS. 1 and 2. Such a mechanism for driving the movable claw 40 is complicated.

A substrate holding apparatus similar to apparatus 30 is also described in the document laid open on Jun. 10, 1987 as Japanese Patent Laying-Open No. 62-128142 and published on Jan. 8, 1981 as Japanese Patent Publication No. 3-785. This apparatus includes similarly a movable wafer clutch portion for clutching the circumference of the wafer. Therefore, the apparatus described in Japanese Patent Publication No. 3-785 has problems similar to those of the apparatus shown in FIGS. 1 and 2.

FIGS. 3 and 4 show a conventional substrate holding apparatus 60 for holding a wafer 62 without using a movable portion. Referring to FIGS. 3 and 4, the substrate holding apparatus 60 includes a rotary plate 66 having the bottom center portion fixed to the end of a shaft 64 of a motor not shown and rotatable in a horizontal plane about the center axis of the shaft 64. A wafer holding member 76 for holding the bottom of the wafer 62 at the location of an orientation flat 82 of the wafer 62, and four wafer holding members 70 are secured to the upper face of the rotary plate 66. The wafer holding members 70 are arranged on a circle on the upper surface of rotary plate 66 with the center of the circle coinciding with the central axis Z of shaft 64. The wafer holding member 76 is slightly displaced inward toward the central axis, Z about which the other wafer holding members 70 are arranged circularly. When wafer 62 is placed on substrate holding apparatus 60, the arc 68 out of the contour line of wafer 62 except for the portion of orientation flat 82 is hold by wafer holding members 70. The portion of orientation flat 82 is held by wafer holding member 76. At this time, the arc 68 of wafer 62 is coaxial with the central axis Z of shaft 64.

The wafer holding member 70 includes a wafer supporting portion 72 fixed on the rotary plate 66 for supporting the bottom of the wafer 62, and a travel regulating portion 74 provided at the center of the wafer supporting portion 72 for regulating the horizontal travel of the wafer 62 supported by the wafer supporting portion 72.

The holding member 76 provided to abut on the orientation flat 82 of the wafer 62 includes a wafer holding portion 78 fixed on the rotary plate 66 for supporting the bottom of the orientation flat 82 at the central portion thereof, and a skid regulating portion 80 projecting from the center of the wafer supporting portion 78 for regulating the horizontal travel and the rotation in the circumferential direction of the wafer 62 to prevent the wafer 62 from skidding with respect to the substrate holding apparatus 60. The wafer holding member 76 is displaced towards the inside of the arc 68 in contract to the other wafer holding members 70 being in contact with arc 68 from outside.

The conventional substrate holding apparatus 60 of FIGS. 3 and 4 operates as follows. The wafer 62 is positioned so that the orientation flat 82 is located above the wafer holding member 76. The positioned wafer 62 is mounted upon the wafer supporting portion 72 of the wafer supporting member 70 and upon the wafer supporting portion 78 of the wafer supporting member 76. Thus, the wafer 62 is supported horizontally with a predetermined distance from the upper face of the rotary plate 66. As described above, the horizontal travel of the wafer 62 is regulated by the travel regulating portion 74 and the skid regulating portion 80. While plate 66 is being rotated by a motor (not shown), skid regulating portion 80 of the wafer holding member 76 prevents the wafer 62 from skidding and rotating relative to the rotary plate 66 while the orientation flat 82 is pressed against the portion 80.

It is understood from the above description that the orientation flat 82 of the wafer 62 must be positioned appropriately with respect to the wafer holding member 76 having the skid regulating portion 80 in the conventional substrate holding apparatus 60 of FIGS. 3 and 4. It is therefore necessary to provide a mechanism for aligning the wafer 62 with respect to the rotary plate 66 in the apparatus (not shown) for providing the wafer and in the substrate holding apparatus 60. Such an aligning mechanism is not preferable because it will complicate the mechanism.

The substrate holding apparatus 60 of FIGS. 3 and 4 had another problem which will be described hereinafter. Wafers having a notch which is cut in a V-shape and smaller than the orientation flat 82 instead of the orientation flat 82 are beginning to be used. A notch has a smaller cut towards the center of the wafer in comparison with an orientation flat 82. Though the skid regulating portion is positioned at a location corresponding to the location of the notch, the displacement of the skid regulating portion towards the center of the wafer becomes smaller in comparison with the case of a wafer with an orientation flat. It is therefore difficult to prevent the skid of the wafer with such a skid regulating portion. Furthermore, in the case of a substrate for an optical disk which is a complete circle without any cut-out portions like an orientation flat or a V-shape notch. The skid regulating portion cannot be displaced with respect to the complete circular substrate. In principle, the apparatus of FIGS. 3 and 4 cannot prevent the substrate from skidding. Although the apparatus of FIGS. 3 and 4 have a simple structure, it can only hold substrates that have a relatively large cut-out portion such as a semiconductor wafer with an orientation flat.

SUMMARY OF THE INVENTION

In view of the foregoing, an object of the present invention is to provide a substrate holding apparatus that can hold a substrate with a simple structure while rotating the same, and to provide a substrate processing apparatus including such a substrate holding apparatus.

Another object of the present invention is to provide a substrate holding apparatus of a simple construction that can carry out aligning more easily in mounting a substrate for holding a rotating substrate, and to provide a substrate processing apparatus including such a substrate holding apparatus.

A further object of the present invention is to provide a substrate holding apparatus that can easily carry out aligning in mounting a substrate on a device for holding a rotating substrate without the need of driving a portion fixing the substrate, and to provide a substrate processing apparatus including such a substrate holding apparatus.

Still another object of the present invention is to provide a substrate holding apparatus that can carry out more easily positioning in mounting a substantially circular substrate having a small V-shape notch or an orientation flat for holding a rotating substrate without the need of driving the portion fixing the substrate, and to provide a substrate processing apparatus including such a substrate holding apparatus.

An additional object of the present invention is to provide a substrate holding apparatus for holding and rotating a complete circular substrate that does not have a small V-shape notch or an orientation flat without the need of driving a claw as the portion fixing the substrate, and to provide a substrate processing apparatus including such a substrate holding apparatus.

According to the present invention, a substrate holding apparatus includes a rotary table rotatable about a predetermined center axis for supporting a substrate in a plane perpendicular to the center axis, and a substrate travel regulating pin for regulating the travel of the substrate in a direction perpendicular to the center axis arranged in a position in contact with the outer edge of the substrate and fixed to the rotary table so that the center of gravity of the substrate supported on the rotary table is located at a predetermined distance from the center axis.

A centrifugal force is created with respect to the substrate when the rotary table rotates about the center axis. Such centrifugal force urges the outer edge of substrate against the substrate travel regulating pins. Consequently, the substrate is rotated together by the resulting frictional force. The substrate can be held and rotated without using a movable claw and the like for holding the substrate. It is not necessary to provide the substrate travel regulating pin displaced from a normal position according to the location of the orientation flat. Therefore, alignment at placing a substrate can be carried out easily even in the case of a substrate having a cut-out portion, such as a small V-shape notch or an orientation flat. The substrate travel regulating pin rotates the substrate with a frictional force generated between the periphery of the substrate and the travel regulating pin as a result of a centrifugal force without engaging a cut-out portion. Therefore, it is also possible to hold and rotate without skidding a circular substrate, even if the substrate does not have a cut-out portion.

According to another aspect of the present invention, a substrate processing apparatus includes a substrate holding apparatus for holding a substrate in a plane perpendicular to a predetermined center axis; a motor for rotating the substrate holding apparatus about the center axis; a nozzle for providing a processing solution to the upper face of the substrate in the substrate holding apparatus; and a splash prevention cup for receiving the processing solution splashed away from the upper face of the substrate that is being held by the substrate holding apparatus and rotated by the motor. The substrate holding apparatus includes a rotary table rotatably attached to a motor to rotate about a center axis mean for holding a substrate in a plane perpendicular to the center axis, and a substrate travel regulating pin for regulating the travel of the substrate in a direction perpendicular to the center axis arranged at a position in contact with the outer edge of the substrate and fixed to the rotary table so that the center of gravity of the substrate supported on the rotary table is located at a predetermined distance from the center axis.

A centrifugal force is created with respect to the substrate when the rotary table rotates about the center axis. Such centrifugal force urges the outer edge of substrate against the substrate travel regulating pins. Consequently, the substrate is rotated together by the resulting frictional force. The substrate can be held and rotated without using a movable claw for holding a substrate. It is not necessary to provide the substrate travel regulating pin displaced from a normal position according to the location of the orientation flat. Therefore, alignment at placing a substrate can be carried out easily even in the case of a substrate having a cut-out portion such as a small V-shape notch or an orientation flat. The substrate travel regulating pin rotates the substrate with a frictional force generated between the periphery of the substrate and the travel regulating pin as a result of a centrifugal force without engaging a cut-out portion. Therefore, it is also possible to hold and rotate, without skidding, a circular substrate that does not have a cut-out portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described hereinafter with reference to the drawings. A substrate processing apparatus for processing a semiconductor wafer having an orientation flat and a substrate holding apparatus therefor are taken as examples for description. It is to be understood that the present invention is not only effective for holding such a semiconductor wafer, but may also be used for holding other substrates, for example, a semiconductor substrate having only a small notch or a complete circular substrate such as an optical disk that does not have cut-out portions and is made of material other than semiconductor, for example, glass substrate.

Figure 5:
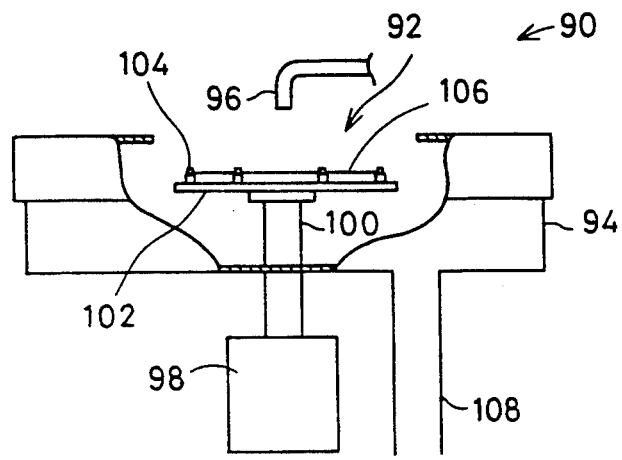
FIG. 5 is a side view of a rotary substrate processing apparatus with a portion broken away, constructed according a first embodiment the present invention.

Referring to FIG. 5, a rotary substrate processing apparatus 90 according to a preferred embodiment of the present invention includes a motor 98 having a vertical shaft 100, a substrate holding apparatus 92 attached to one end of the shaft 100 for holding a wafer 106, a nozzle 96 for providing a predetermined processing solution onto the wafer 106 such as a detergent including acid, alkali, various solvents, and pure water, and processing solutions such as a photoresist solution, a developer, or an etchant, and a cup 94 provided to surround the substrate holding apparatus 92 for receiving the processing solution splashed away from the rotating wafer 106 held by the substrate holding apparatus 92. A drainage tube 108 is provided at the bottom of the cup 94 to discharge the collected processing solution through the drainage tube 108.

Figure 6:
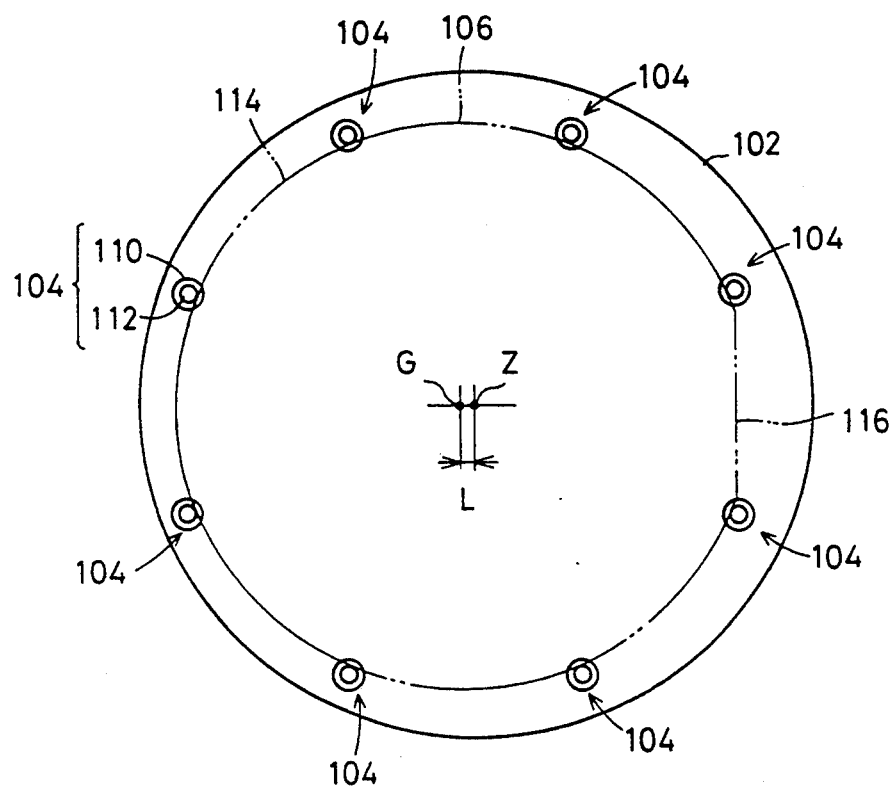
FIG. 6 is the plan view of a substrate holding apparatus according to the first embodiment of the present invention.
Figure 7:
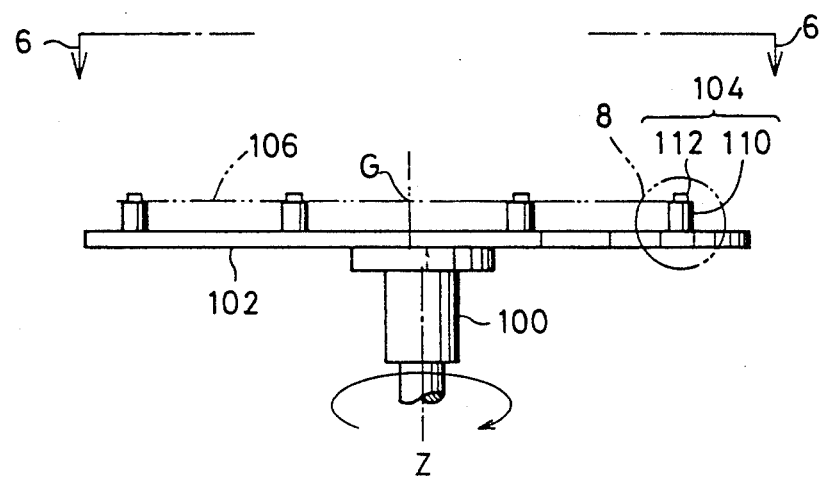
FIG. 7 is an enlarged side view of a portion of the substrate holding apparatus according to the first embodiment of the present invention.

Referring to FIGS. 5–7, the substrate holding apparatus 92 according to an embodiment of the present invention serves to hold and rotate a substantially circular wafer 106 having an orientation flat 116. The substrate holding apparatus 92 includes a rotary plate 102 having the center of the lower surface fixed to the end of the shaft 100 and rotatable within a horizontal plane, and eight wafer holding members 104 attached to the upper face of the rotary plate 102. The center of the rotary plate 102 coincides with the center axis Z of the shaft 100.

Each wafer holding member 104 includes a wafer holding portion 110 provided on the rotary plate 102 for supporting the bottom of the wafer 106 with its upper face, and a skid regulating portion 112 provided on the center of the wafer holding portion 110 for regulating the wafer 106 supported horizontally by the wafer holding portion 110 from traveling in the horizontal direction and for preventing the wafer 106 from skidding relative to the rotary plate 102.

The wafer holding members 104 are arranged in a circle on the rotary plate 102 in equal intervals such that each skid regulating portion 112 touches a circle 114 from outside which substantially coincides with an arc portion of wafer 106 except for orientation flat 116. The center of the circle 114 is displaced by a predetermined distance L from the center axis Z of the shaft 100. Therefore, the wafer holding members 104 are arranged so that the center G of the arc portion of the wafer 106 positioned by the wafer holding members 104 is displaced by a predetermined distance L from the center axis Z of the rotary plate 102, thereby the center of gravity of wafer 106 is displaced from the central axis Z of rotary plate 102.

Figure 8:
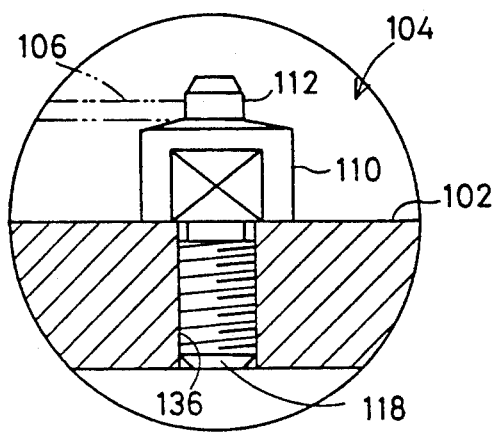
FIG. 8 is a fragmentary sectional view of the substrate holding apparatus of FIG. 7, with the components enlarged.

Referring to FIG. 8, each wafer holding member 104 includes a wafer holding portion 110, and a skid regulating portion 112 provided projecting from the upper surface of the wafer supporting portion 110. A threaded portion 118 is provided at the bottom of the wafer supporting portion 110. A tapped through-hole 136 is formed in the rotary table 102 where the wafer holding member 104 is to be fixed. The wafer holding member 104 is fixed to the rotary plate 102 by mating portion 118 with the through-hole 136.

As shown in FIG. 8, the top of the wafer supporting portion 110 has a shape of a frustum of cone with a height smaller in comparison with the bottom, and the skid regulating portion 112 is provided on the top face thereof. The wafer supporting portion 110 and the skid regulating portion 112 are integrally formed. Wafer 106 has the outer periphery thereof supported by the conical surface on the top of the wafer supporting portion 110. Wafer holding member 104 is arranged so that the periphery of the wafer 106 is abutted against the skid regulating portion 112 when the wafer 106 is mounted on the wafer supporting portion 110.

The substrate processing apparatus 90 and the substrate holding apparatus 92 of FIGS. 5–8 operate as follows. By a wafer sender not shown, the wafer 106 is positioned above substrate holding apparatus and then lowered as shown in FIG. 6 and mounted on the wafer supporting portion 110 of the wafer holding member 104. The wafer 106 is supported horizontally at a predetermined distance from the surface of the rotary plate 102 by the wafer supporting portions 110. At this time, the orientation flat 116 of the wafer 106 may be positioned as shown in FIG. 6 or at another position.

Referring to FIG. 5, a predetermined processing solution is supplied onto the wafer 106 from the nozzle 96. Then, the motor 98 is driven to rotate at a predetermined velocity the rotary plate 102 in the substrate holding apparatus 92.

Note that the processing solution is selected as required in accordance with the desired process. If the substrate processing apparatus 92 is used for cleaning process, deionized water or solvent, for example, acetone, is selected as the processing solution. In a liquid application process, photoresist or the like is selected. In developing process, developer is selected.

As shown in FIG. 6, the center of rotation Z of the rotary plate 102 is deviated from the center G of arc portion of the wafer 106 by a predetermined distance L, and the center of gravity of wafer 106 is also displaced from the center of rotation Z of rotary plate 102. As the rotary plate 102 is rotated, a centrifugal force is exerted from the center of rotation Z towards the center of gravity in the wafer 106. This causes the outer edge of the wafer 106 to be forced towards the four skid regulating portions 112 of the wafer holding members 104 on the side of the displaced center of gravity in the case of the positioning shown in FIG. 6. Because a frictional force is exerted between the wafer 106 and the skid regulating portions 112 on the side of the displaced center of gravity in proportion to the pressing force therebetween, the wafer 106 and the rotary plate 102 rotate integrally. The wafer 106 will not skid relatively with respect to the rotary plate 102.

Figure 1:
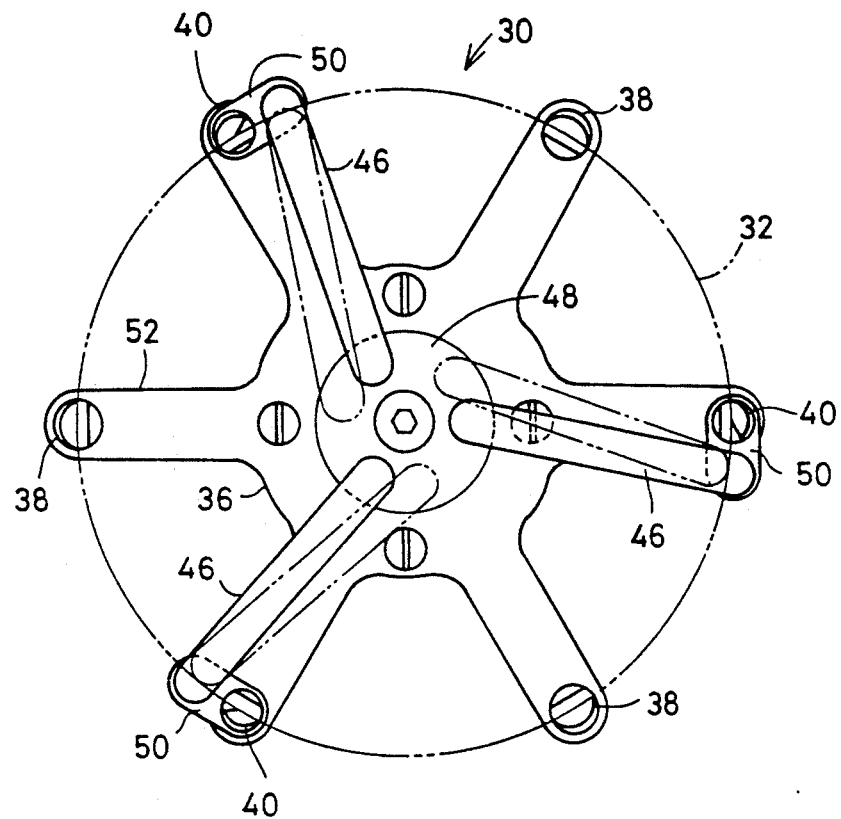
FIG. 1 is a plan view of a first conventional substrate holding apparatus.
Figure 2:
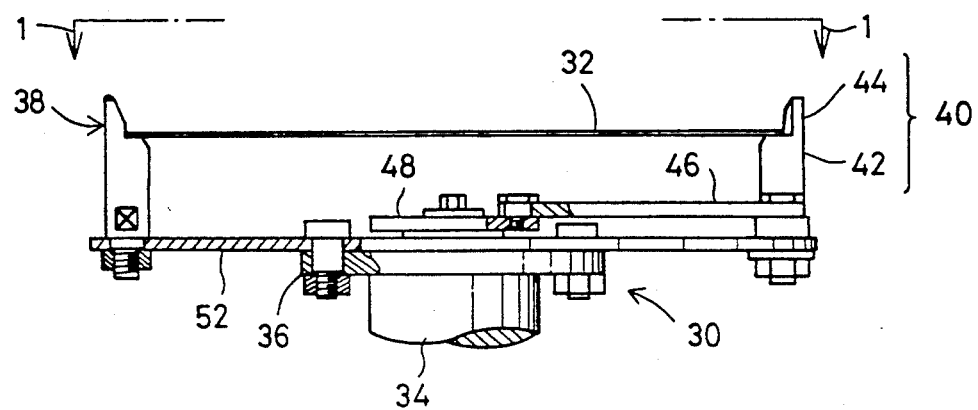
FIG. 2 is a side view of the first conventional substrate apparatus.

The substrate holding apparatus of the present embodiment differs from the conventional apparatus shown in FIGS. 1 and 2 in that a movable claw for holding the wafer is not required. The mechanism for driving the movable claw is also not necessary. Therefore, the mechanism is simple and maintenance more easy to carry out. A reduction in faults is also expected.

If the wafer 106 is of circular configuration, a wafer 106 including an orientation flat 106 or a notch does not require aligning of that orientation flat or the notch with respect to a particular wafer holding member. This eliminates the need of a mechanism for positioning the wafer or adjusting the angle of the wafer in mounting it.

Figure 9:
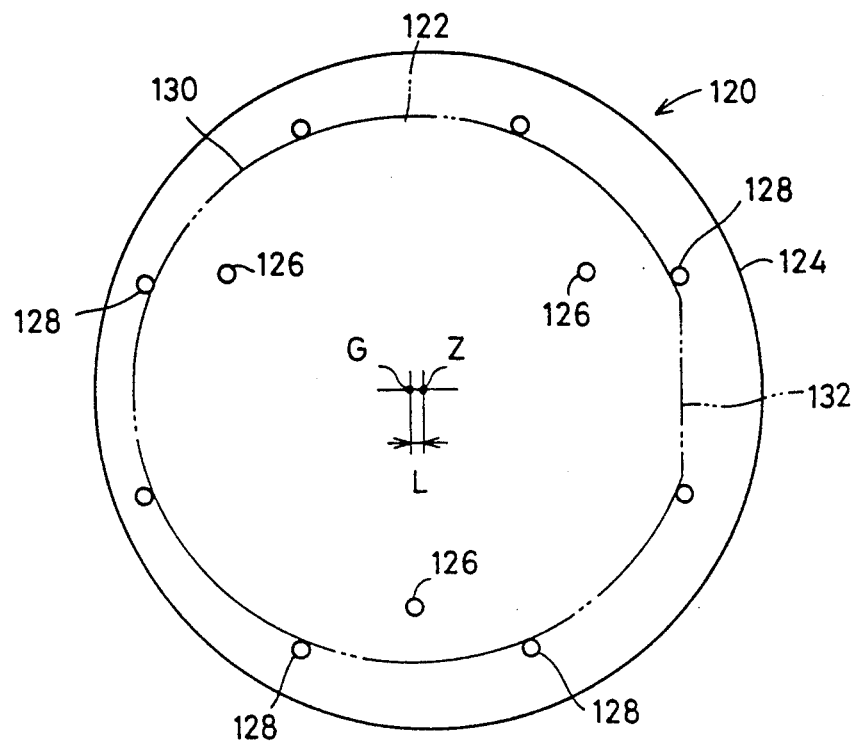
FIG. 9 is a plan view of a substrate holding apparatus according to a second embodiment of the present invention.
Figure 10:
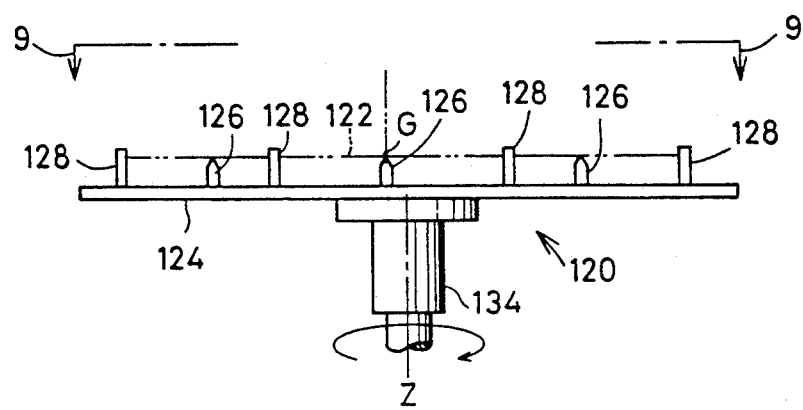
FIG. 10 is a side view of the substrate holding apparatus according to the second embodiment of the present invention.

The substrate holding apparatus according to a second embodiment of the present invention shown in FIGS. 9 and 10 differs from the first embodiment in that the wafer supporting portion and the skid regulating portion are provided separately. Referring to FIGS. 9 and 10, the substrate holding apparatus 120 of the second embodiment includes a rotary plate 124 having the center of its bottom fixed to the end of a shaft 134 of a motor not shown. On the rotary plate 124 are provided eight skid regulating pins 128 arranged in equal intervals to be in contact from outside with a circle 130 which coincides with the perimeter of an arc with the center of the arc being kept at a predetermined displace L from a center of rotation Z of the rotary plate 124 and having a radius equal to the radius of the arc portion of the wafer 122 except for a orientation flat 132, and three wafer holding pins 126 provided inner of the circle 130 formed by the skid regulating pins 128 for supporting the bottom of the wafer 122 by the tips thereof in parallel with the rotary plate 124.

The skid regulating pins 128 are arranged so that the center G of the arc portion of the wafer 122 is displaced by a predetermined distance L from the center of rotation Z of the rotary plate 124 when the wafer 122 is mounted on the wafer supporting pins 126 so as to be registered to the skid regulating pins 128. In the arrangement shown in FIG. 9, the orientation flat 132 of the wafer 122 is disposed between two skid regulating pins 128. The position of the wafer 122 is not limited to that shown in FIG. 9. For example, the orientation flat 132 may be arranged opposing one skid regulating pin 128. Although there will be a gap between the orientation flat 132 and the skid regulating pin 128 in this case, it will not affect the operation of the apparatus.

The substrate holding apparatus of the second embodiment shown in FIGS. 9 and 10 operates as follows. A wafer sender not shown positions a wafer 122 above the rotary plate 124 so that the perimeter of the wafer 122 touches the inner sides the skid regulating pins 128. By lowering the wafer 122, three wafer supporting pins 126 support the bottom of the wafer 122 with respective tips. Thus, wafer 122 is supported in parallel with the top surface of the rotary plate 124 with a predetermined distance therebetween. The number of wafer supporting pins 126 is not limited to three, and may be more than three. An embodiment can also be considered where there are no wafer supporting pins 126. According to another embodiment, there may be omitted wafer supporting pins 126 as described above. In this case, the wafer 122 is mounted on the top surface of the rotary plate 124.

In the embodiment of FIGS. 9 and 10, the wafer 122 has its outer edge abutted against the skid regulating pins 128. This regulates the wafer 122 from traveling in the horizontal direction.

By driving a motor not shown, the shaft 134 and the rotary plate 124 are rotated in a predetermined direction, for example clockwise, about the center of rotation Z shown in FIG. 9. The center G of the arc portion of the wafer 122 is displaced from the center of rotation Z by a predetermined distance L, and the center of gravity of wafer 122 is also displaced from the center of rotation Z. Therefore, a centrifugal force is exerted from the center of rotation Z towards the center of gravity in the wafer 122. The periphery of the wafer 122 is pressed towards the four skid regulating pins 128 on the side of the displaced center of gravity by the centrifugal force. A frictional force is generated between the periphery of the wafer 122 and the four skid regulating pins 128 on the side of the displaced center of gravity by the pressing force. Thus, wafer 122 rotates together with the rotary plate 124 without skidding by virtue of this frictional force.

In the embodiment of FIGS. 9 and 10, the skid regulating pins 128, the wafer supporting pins 126, and the rotary plate 124 are integral with one another. However, they may be detachably fixed to the rotary plate 124 by individual screws (not shown) as in the case of wafer holding members 76 and 70 in the first embodiment.

The rotary tables 102 and 124 in the above-described first and second embodiments to which the wafer holding members 104, the wafers supporting pins 126, and the skid regulating pins 128 are attached have a circular configuration. However, the configuration of the rotary table is not limited to such a flat circle. It may have an arm as shown in FIG. 1. It may also have the configuration shown in FIG. 11.

Figure 11:
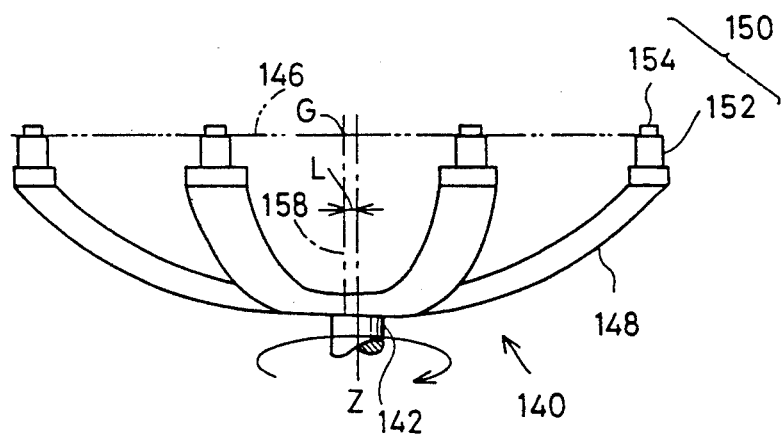
FIG. 11 is a side view of a substrate holding apparatus according to a third embodiment of the present invention.

Referring to FIG. 11, a substrate holding apparatus 140 according to a third embodiment of the present invention includes eight arms 148 having their bases fixed to the shaft 142 of a motor not shown, and having the end portions curved and expanded upwards and radially. Note that only four of the eight arms 248 are represented in FIG. 11.

The eight arms 148 are all fixed to the shaft 142 to rotate integrally with the shaft 142. The upper ends of the arms 148 are located on the same plane. A wafer holding member 150 is provided at the tip of each arm 148.

The wafer holding member 150 includes a wafer supporting portion 152 having its base fixed to the top of the arm 148 for supporting the peripheral bottom of the wafer 146 with its upper face, and a skid regulating portion 154 provided on the wafer supporting portion 152 and arranged to abut against the perimeter of the wafer 146. The skid regulating portions 154 are arranged in equal intervals so as to substantially form a circle.

When the wafer 146 is mounted on the wafer supporting portion 152 so as to have its periphery abutted against this skid regulating portion 154, the center G of the arc portion of the wafer 146 is located on an extended line of a straight line 158 shown in FIG. 11. The position of the skid regulating portion 154 is selected so that the center G of the arc portion is located as such. The center of rotation Z of the arms 148 coincides with the center axis of the shaft 142. The center G of the arc portion of the wafer 146 is a predetermined distance L distant from the center of rotation Z, as shown in FIG. 11, and the center of gravity of wafer 146 is also displaced from center of rotation Z.

The apparatus of FIG. 11 operates as follows. By a sender not shown, a wafer 146 is mounted on the wafer supporting portions 152 so as to be aligned to the skid regulating portions 154. As a result, the wafer 146 is held horizontally. The horizontal travel of the wafer 146 is regulated by the skid regulating portions 154.

By driving a motor not shown, the shaft 142 and the arms 148 rotate at a predetermined velocity about the center of rotation Z. As described above, the center of gravity of the wafer 146 is displaced from the center of rotation Z. Therefore, a centrifugal force is generated in a direction from the center of rotation Z towards the center of gravity of the wafer 146 in the wafer 146. This centrifugal force causes a portion of the periphery of the wafer 146 on the side of the displaced center of gravity to be forced against the skid regulating portions 154. A frictional force is generated between the periphery of the wafer 146 and the skid regulating portions 154 by this urging force. The wafer 146 is rotated together with the arms 148 without skidding on account of the frictional force.

According to the present invention, the center of the arc portion of a substrate is displaced by a predetermined distance from the center of rotation when a substrate is mounted on a substrate supporting means so as to be aligned to the skid regulating portion. Therefore, the following advantages can be obtained that were not seen in conventional apparatus.

(1) By rotating the rotary plate, a centrifugal force is generated with respect to the substrate in a direction from the center shaft towards the center of gravity of the substrate. This centrifugal force causes the periphery of the substrate to be urged against the skid regulating portion to produce a frictional force. The substrate rotates integrally with the rotating plate owing to this frictional force.

(2) Differing from the conventional apparatus shown in FIGS. 1 and 2, it is not necessary to provide a movable claw for holding a substrate. This results in a more simple structure for the apparatus thereby lowering the manufacturing cost and facilitating the maintenance. A reduction in the generation of faults is also expected.

Figure 3:
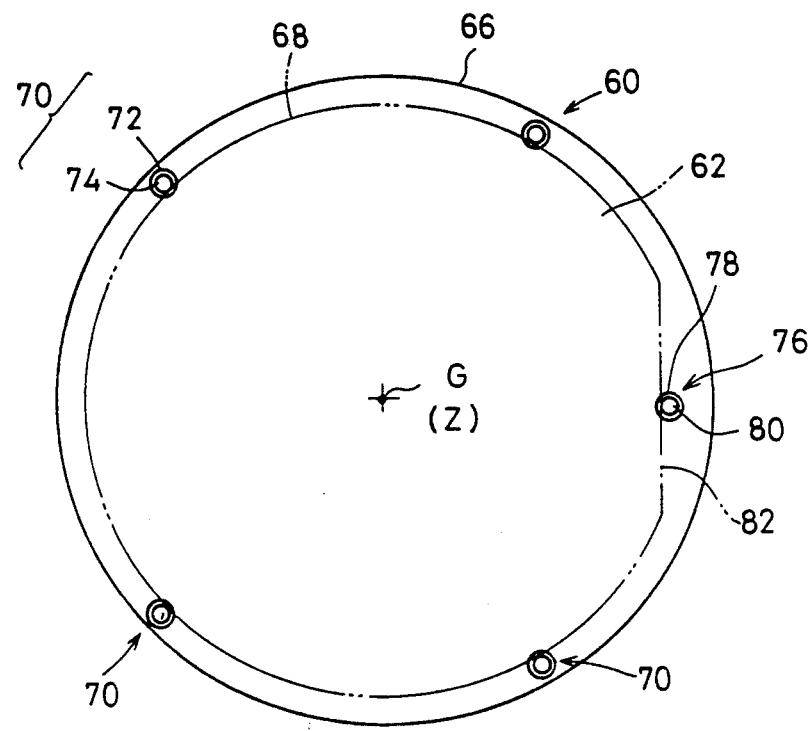
FIG. 3 is a plan view of a second conventional substrate holding apparatus.
Figure 4:
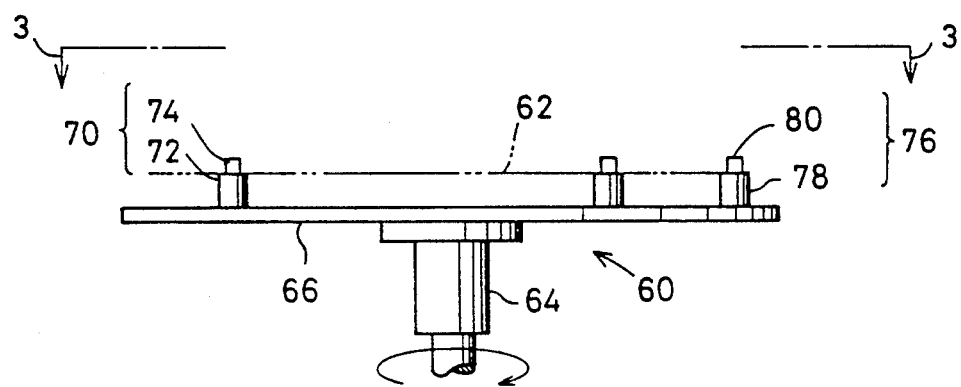
FIG. 4 is a side view of the second conventional substrate holding apparatus.

(3) The necessity for aligning the direction of the orientation flat of a substrate and the position of the substrate holding apparatus is eliminated or the conditions thereof alleviated in the case of processing a substantially circular substrate, in comparison with the conventional apparatus of FIGS. 3 and 4. The mechanism for positioning the substrate and the rotary plate is not necessary or can be simplified to save the time required for setting the substrate and the substrate processing apparatus.

(4) A substantially circular substrate only having a small cut therein such as notch, or a substrate for an optical disk with no notches can be held without skidding.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate holding apparatus comprising:
   substrate supporting means rotatable about a predetermined vertical center axis for supporting a substrate in a horizontal plane with said substrate having its center of gravity displaced horizontally from said vertical center axis,
   said substrate holding apparatus also comprising substrate travel regulating means arranged in a position to be contacted by the outer edge of the substrate and fixed to said substrate supporting means so that the center of gravity of the substrate supported on said substrate supporting means is kept at a predetermined distance from said center axis for regulating travel of said substrate in a horizontal direction,
   whereby as said substrate supporting means rotates about said vertical center axis the outer edge of said substrate is urged against said substrate travel regulating means to frictionally engage same and by so doing said substrate rotates about said vertical center axis to generate a centrifugal force that maintains frictional engagement of said substrate with said substrate travel regulating mans for rotational driving of said substrate by said substrate supporting means and without skidding therebetween.

2. A substrate holding apparatus for holding a substrate whose contour has an arc portion, said apparatus comprising:
   substrate supporting means rotatable about a predetermined vertical center axis for supporting a substrate on a horizontal plane, and
   substrate travel regulating means arranged in a position to contact the outer edge of the substrate and fixed to said substrate supporting means so that the center of the arc portion of the substrate supported on said substrate supporting means is kept at a predetermined distance from said center axis for regulating the travel of said substrate in a horizontal direction,
   wherein the outer edge of said substrate is urged against said substrate travel regulating means by a centrifugal force generated with respect to said substrate when said substrate supporting means is rotated about said center axis so that said substrate is rotated together with said substrate supporting means by a resulting frictional force.

3. The substrate holding apparatus according to claim 2, comprising a plurality of said substrate travel regulating means.

4. The substrate holding apparatus according to claim 3, wherein
   said substrate has an outer edge of a substantial circle and said arc portion is disposed at said outer edge,
   said plurality of substrate travel regulating means are arranged along the perimeter of a circle defined by a radius predetermined according to a size of a substrate with the center of said circle being kept at a predetermined distance from said center axis.

5. The substrate holding apparatus according to claim 4, wherein said substantial circle is of a predetermined radius, and said predetermined distance is selected to be smaller than said predetermined radius.

6. The substrate holding apparatus according to claim 5, comprising at least three of said substrate travel regulating means.

7. The substrate holding apparatus according to claim 6, wherein said substrate travel regulating means are provided at equal intervals on said perimeter of the circle.

8. The substrate holding apparatus according to claim 3, wherein said substrate supporting means comprises a rotary member fixed to a shaft of a rotary means for rotating together with the rotation of said shaft and for supporting said substrate in a horizontal position.

9. The substrate holding apparatus according to claim 8, wherein said rotary member comprises a rotary plate having a flat surface and a bottom, and having the center of said bottom fixed to said shaft.

10. The substrate holding apparatus according to claim 9, wherein said rotary member further comprises at least three substrate supporting members projecting from said surface of said rotary plate at a height equal to each other for supporting the bottom of said substrate with at least a portion of the upper faces of said supporting members.

11. The substrate holding apparatus according to claim 10, wherein said substrate has an outer edge of a substantial circle with said arc portion being disposed at said edge, and
   said at least three substrate supporting members are arranged on the surface of said rotary plate along the perimeter of a circle defined by a radius predetermined according to a size of a substrate to be held with the center of said circle being kept at a predetermined distance from said center axis.

12. The substrate holding apparatus according to claim 11, comprising at least three of said substrate travel regulating means.

13. The substrate holding apparatus according to claim 12, wherein said substrate travel regulating means are all provided on the upper face of said substrate supporting members.

14. The substrate holding apparatus according to claim 13, wherein said substrate supporting members are provided at equal intervals on the perimeter of said circle.

15. The substrate holding apparatus according to claim 14, wherein each of said substrate travel regulating means is provided individually on said substrate supporting member.

16. The substrate holding apparatus according to claim 12, wherein said substrate travel regulating means are provided on all of said substrate supporting members.

17. The substrate holding apparatus according to claim 16, wherein said substrate travel regulating means and said substrate supporting members are formed integrally.

18. The substrate holding apparatus according to claim 17, wherein:
a plurality of tapped holes are formed in said rotary plate,
each of said substrate supporting members comprises a projection formed on said surface, and
a stem provided below said projection and threaded so as to engage with said tapped hole in said rotary plate, and
each of said substrate supporting members is detachably attached to said rotary plate by said stem.

19. The substrate holding apparatus according to claim 12, wherein each of said substrate travel regulating means comprises a substrate travel regulating pin on said rotary plate and projecting higher than said substrate supporting member.

20. The substrate holding apparatus according to claim 19, comprising three of said substrate supporting members.

21. The substrate holding apparatus according to claim 20, wherein said substrate supporting members are fixed to the surface of said rotary plate so as to form a triangle with respect to each other.

22. A substrate processing apparatus comprising a substrate holding apparatus as defined by claim 2, said substrate processing apparatus being operatively constructed to apply a processing solution to the upper face of a substrate held in a horizontal plane by said substrate holding apparatus for processing the upper face of said substrate, said substrate processing apparatus also comprising:
rotary means for rotating said substrate holding apparatus about said center axis;
processing solution providing means for providing a processing solution to the surface to the surface of said substrate on said substrate holding apparatus; and
splash prevention means for receiving the processing solution that is splashed away from the upper face of the substrate held by said substrate holding apparatus and rotated by said rotary means.

23. An apparatus according to claim 22, wherein said processing solution provided by said processing solution providing means is a detergent.

* * * * *